(12) United States Patent
Lin et al.

(10) Patent No.: US 9,997,643 B2
(45) Date of Patent: Jun. 12, 2018

(54) DIODE STRUCTURE

(71) Applicant: UNITED MICROELECTRONICS CORP., Hsin-Chu (TW)

(72) Inventors: Ke-Feng Lin, Taipei (TW); Hsuan-Po Liao, Hsinchu County (TW); Ming-Shun Hsu, Miaoli County (TW); Chih-Chung Wang, Hsinchu (TW); Chiu-Te Lee, Hsinchu County (TW); Shih-Teng Huang, Taichung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 185 days.

(21) Appl. No.: 14/989,814

(22) Filed: Jan. 7, 2016

(65) Prior Publication Data
US 2017/0162721 A1 Jun. 8, 2017

(30) Foreign Application Priority Data
Dec. 7, 2015 (TW) .............................. 104140913 A

(51) Int. Cl.
*H01L 29/02* (2006.01)
*H01L 29/861* (2006.01)
*H01L 29/06* (2006.01)

(52) U.S. Cl.
CPC ...... *H01L 29/8615* (2013.01); *H01L 29/0649* (2013.01); *H01L 29/0692* (2013.01); *H01L 29/861* (2013.01)

(58) Field of Classification Search
CPC ............. H01L 21/8224; H01L 29/8615; H01L 29/0649; H01L 29/861; H01L 29/0692
USPC ................................................... 257/575, 593
See application file for complete search history.

(56) References Cited

U.S. PATENT DOCUMENTS

| 5,432,479 | A  | * | 7/1995  | Wong ...................... H03F 1/301 327/362 |
| 6,828,650 | B2 |   | 12/2004 | de Frésart |
| 8,324,713 | B2 |   | 12/2012 | Chen |
| 2005/0116254 | A1 | * | 6/2005 | Verma ............... H01L 29/66242 257/197 |
| 2010/0213575 | A1 | * | 8/2010 | Chen .................. H01L 21/8224 257/575 |
| 2016/0133731 | A1 | * | 5/2016 | Song ..................... H01L 29/735 257/579 |

* cited by examiner

*Primary Examiner* — Vongsavanh Sengdara
(74) *Attorney, Agent, or Firm* — Winston Hsu

(57) ABSTRACT

A diode structure includes a rectangular first doping region, and a second doping region surrounds the first doping region wherein the first doping region and the second doping region are separated by a first isolation structure. A third doping region surrounds the second doping region wherein the second doping region and the third doping region are separated by a second isolation structure. The first isolation structure, the second doping region, the second isolation structure and the third doping region are arranged in a quadruple concentric rectangular ring surrounding the first doping region.

14 Claims, 5 Drawing Sheets

| Mode | Cthode | Anode | Electrode A | Electrode B |
|---|---|---|---|---|
| Stand by | $V_{DD}$ | $V_{DD}$ | $V_{DD}$ | $V_{GND}$ |
| On | $V_{on}$ | $V_{DD}$ | $V_{DD}$ | $V_{GND}$ |

$V_{DD} = 5V$
$V_{on} = 4.3$ to $4.4V$
$V_{GND} = 0V$

DIODE STRUCTURE

BACKGROUND OF THE INVENTION

1. Field of the Invention

The present invention generally relates to a diode structure. More particularly, the present invention relates to a diode with multiple-concentric-rectangular-ring structure.

2. Description of the Prior Art

A charge pump is a kind of circuit design which is very common in a circuit system. The charge pump is able to generate an output voltage greater in magnitude than the input voltage. The charge pump is applied widely in different kind of chips. For example, a charge pump is usually integrated in an electrical erasable programmable read only memory (EEPROM), which usually needs a voltage for the programming and erasing operations higher than the voltage available from the peripheral circuit. The integrated charge pump may multiply the voltage from the circuit, to provide an appropriate voltage for the programming and erasing operations of the memory.

With the integration of the semiconductor manufacturing technology and the micro-electromechanical systems (MEMS), a semiconductor chip (biochip) which is able to detect and monitor the biological signals is developed. Generally, the electrical signal generated by an organism is very small, such as only several millivolts (mV), or even only several microvolts (μV). To detect and analyze the biological signal, a charge pump is usually integrated in a biochip to multiply the voltage of the biological electrical signal to a magnitude within the operation voltage range of the semiconductor devices embedded in the chip.

The typical charge pump circuit, for example, the Dickson Charge Pump, comprises serial connected clocked diode-capacitor voltage multipliers. By controlling the capacitors' charging/discharging cycle and the diodes' dis-conducting/conducting cycle, the charges are pumped and the total number of the charges is multiplied successively along the diode chain in the forward-biased direction, and therefore the current is multiplied. However, in real process of the charge pumping, a portion of the current would tend to flow to the substrate instead of the ideal path aforesaid when the diode is forward-biased and conducting. The current flowing to the substrate becomes the leakage current. This phenomenon would have negative influences on the efficiency of the charge pump. Therefore, there is still a need in the field to provide a diode with better performance, which has smaller leakage current and larger forward current.

SUMMARY OF THE INVENTION

It is one objective of the invention to provide a diode structure, which has larger forward current and smaller leakage current and better performance.

According to one aspect of the present invention, a diode structure is provided. The diode comprises a substrate. A first doping region is disposed in the substrate, wherein the first doping region has a first conductivity type and is a rectangle from the top view with an aspect ratio larger than 2. A second doping region surrounding the first doping region and having a second conductivity type. A first isolation structure is disposed between the first doping region and the second doping region. A third doping region surrounds the second doping region. A second isolation structure is disposed between the second doping region and the third doping region. The first isolation structure, the second doping region, the second isolation structure and the third doping region are arranged in a quadruple-concentric-rectangular-ring surrounding the first doping region.

According to one embodiment of the invention, the diode structure further comprises a connecting structure, which connects the second doping region and the third doping region.

According to one embodiment of the invention, the aspect ratio of the first doping region is between 2 and 10.

According to one embodiment of the invention, the aspect ratio of the first doping region is between 10 and 20.

According to one embodiment of the invention, the aspect ratio of the first isolation structure, the second doping region, the second isolation structure and the third doping region is substantially the same as that of the first doping region.

According to one embodiment of the invention, the first doping region, the second doping region and the first isolation structure are disposed in a first well which has the second conductivity type.

According to one embodiment of the invention, the first well, the third doping region and the second isolation structure are disposed in a deep well.

According to one embodiment of the invention, the third doping region and the deep well have the first conductivity type.

According to one embodiment of the invention, the third doping region and the deep well have the second conductivity type.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

DETAILED DESCRIPTION

The present invention will now be described with reference to the attached drawings to provide a thorough understanding. Furthermore, some system configurations and process steps are not disclosed in detail, as these should be well-known to those skilled in the art. Other embodiments maybe be utilized, and structural, logical, and electrical changes may be made without departing from the scope of the present invention.

Figure 1:
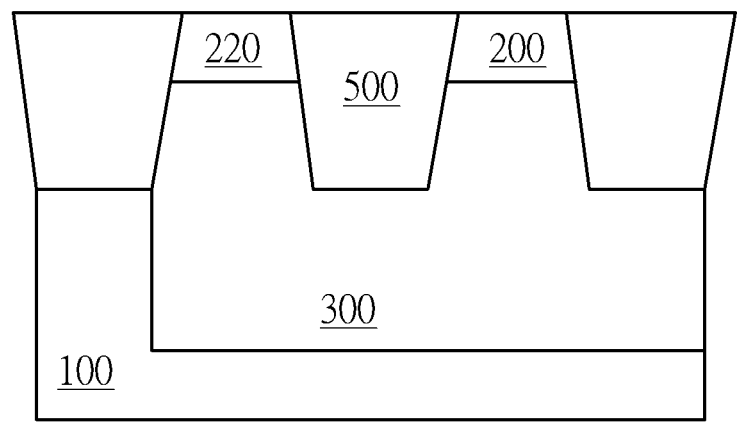
FIG. 1 and FIG. 2 are the schematic cross-sectional diagrams of the conventional diode of the prior art.
Figure 2:
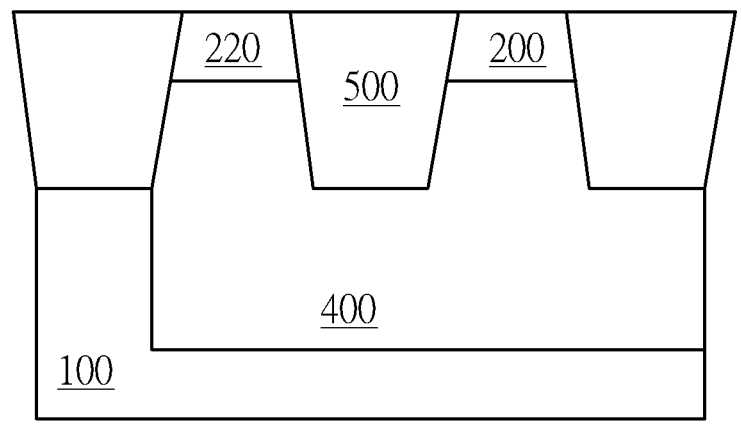

FIG. 1 and FIG. 2 are the schematic cross-sectional diagrams of two types of conventional diodes of the prior art.

Please refer to FIG. 1, which is the cross-sectional diagram of an N+/PW diode. The heavily doped N+ doping region 200 and the P+ doping region 220 are disposed in the P well 300, and are separated by the isolation structure 500. When the diode is forward-biased, that is, when the electrical potential of the P+ doping region 220 is relatively positive with respect to the electrical potential of the N+ doping region 200, the potential barrier of the P/N junction between the N+ doping region 200 and the P well 300 is lowered, allowing a forward current $I_f$ (not shown) to flow from the P+ doping region 220, along the P well 300 under the isolation structure 500, and across the P/N junction between the N+ doping region 200 and the P well 300, and finally to the N+ doping region 200. According to the flow direction as described above, the N+ doping region 200 is considered to be the cathode of the diode, and the P+ doping region 220 is the anode. This type of diode is usually used in an amplifier or a rectifier circuit.

Please refer to FIG. 2, which is the cross-sectional diagram of a P+/NW diode. The heavily doped N+ doping region 200 and the P+ doping region 220 are disposed in the N well 400, and are separated by the isolation structure 500. When the diode is reverse-biased, that is, when the electrical potential of the N+ doping region 200 is relatively positive with respect to the electrical potential of the P+ doping region 220, the potential barrier of the P/N junction between the P+ doping region 220 and the N well 400 is enlarged, blocking the current flow, and the diode is disconnected. When the reverse bias voltage is larger than the breakdown voltage of the P/N junction between the P+ doping region 220 and the N well 400, the junction breaks down, allowing a reverse current $I_r$ (not shown) to flow from the N+ doping region 200 to the P+ doping region 220. This type of diode is usually used as in a constant voltage device or an ESD (electrostatic discharge) device.

However, the leakage and the insufficient efficiency problems still exist in the conventional diodes as shown previously. One objective of the present invention is to provide a diode with the multiple-concentric-rectangular-ring structure, which has better performance and lower leakage current.

Figure 3:
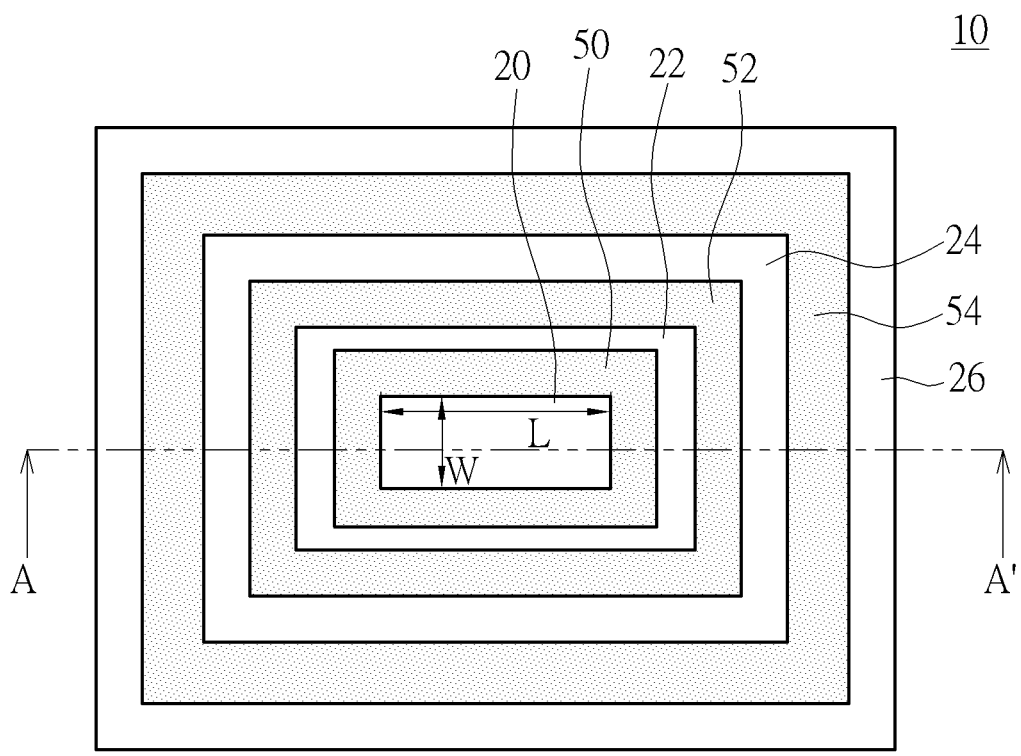
FIG. 3 is a schematic top view of a diode according to one embodiment of the invention.
Figure 4:
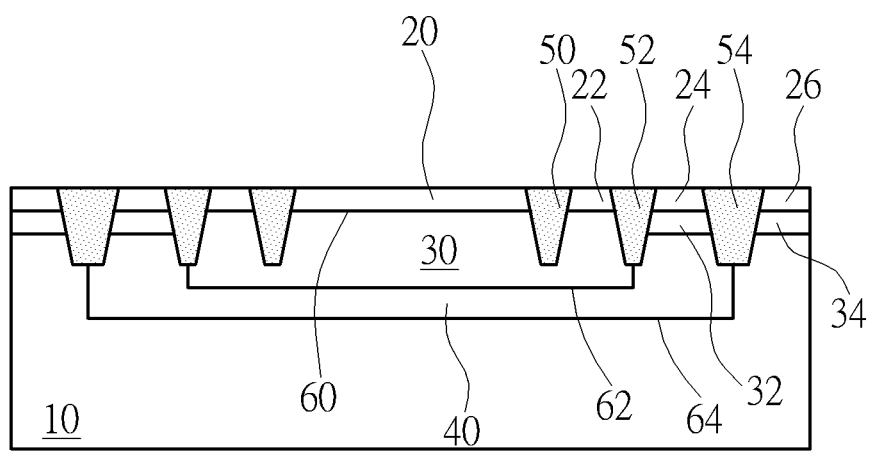
FIG. 4 is the schematic cross-sectional diagram taken along the line A-A' in FIG. 3.

Please refer to FIG. 3 and FIG. 4, which are the schematic top view and the corresponding cross-sectional diagram according to one embodiment of the present invention.

As shown in FIG. 3, the diode comprises a substrate 10. A first doping region 20 is disposed in the middle of the substrate 10. The first doping region 20 is rectangular, having a length L and a width W, and has a specific aspect ratio of dividing the length L by the width W (L/W). According to one embodiment of the present invention, for example, the aspect ratio of the first doping region 20 is 2. The first doping region 20 is surrounded by multiple rectangular ring regions, including, from the inside to outside, the first isolation structure 50, the second doping region 22, the second isolation structure 52, the third doping region 24, the third isolation structure 54 and the fourth doping region 26. These regions are arranged to form a multiple-concentric-rectangular-ring structure around the first doping region 20. Respectively, each of these regions may have the same or different aspect ratio as the first doping region 20. According to one embodiment of the present invention, the first isolation structure 50, the second doping region 22, the second isolation structure 52, the third doping region 24, the third isolation structure 54 and the fourth doping region 26 may have substantially the same aspect ratio as the first doping region 20.

Please refer to FIG. 4, which is the schematic cross-sectional diagram taken along the line A-A' in FIG. 3. The first doping region 20 and the second doping region 22 are separated by the first isolation structure 50. The third doping region 24 and the second doping region 22 are separated by the second isolation structure 52. The fourth doping region 26 and the third doping region 24 are separated by the third isolation structure 54. The first doping region 20, the first isolation structure 50 and the second doping region 22 are disposed in the first well 30. Meanwhile, the first well 30, the second isolation structure 52 and the third doping region 24 are disposed in a deep well 40. Optionally, a second well 32 maybe be disposed between the third doping region 24 and the deep well 40, and a third well 34 may be disposed between the fourth doping region 26 and the substrate 10.

The first isolation structure 50, the second isolation structure 52 and the third isolation structure 54 maybe, for instance, shallow trench isolation structures and the depths may be the same or different, to provide a better isolation effect, reducing the leakage current $I_{sub}$ and the reverse current $I_r$. According to one preferred embodiment, the depth of the first isolation structure 50 is deeper than the depths of the first doping region 20 and the second doping region 22, but is shallower than the depth of the first well 30. Meanwhile, the depth of the second isolation structure 52 is deeper than the depths of the second doping region 22 and the third doping region 24, but is shallower than the depth of the deep well 40.

The substrate 10 may comprise a semiconductor substrate, such as, for example, a silicon substrate, a silicon contained substrate, a silicon-on-insulator (SOI) substrate or other suitable semiconductor materials. The first doping region 20 may be of a conductivity type, for instance, the N-type. The second doping region 22 and the first well 30 may be the conductive type which is opposite to the first doping region 20, for instance, the P-type. The third doping region 24, the second well 32 and the deep well 40 may all have N-type conductivity or all have P-type conductivity according to different embodiments. The fourth doping region 26, the third well 34 and the substrate 10 may have different conductive type from the third doping region 24 and the deep well 40. For example, when the third doping region 24, the second well 32 and the deep well 40 have the first conductivity, the fourth doping region 26, the third well 34 and the substrate 10 may have the second conductive type. When the third doping region 24, the second well 32 and the deep well 40 have the second conductivity, the fourth doping region 26, the third well 34 and the substrate 10 may have the first conductive type.

Figures 5, 6:
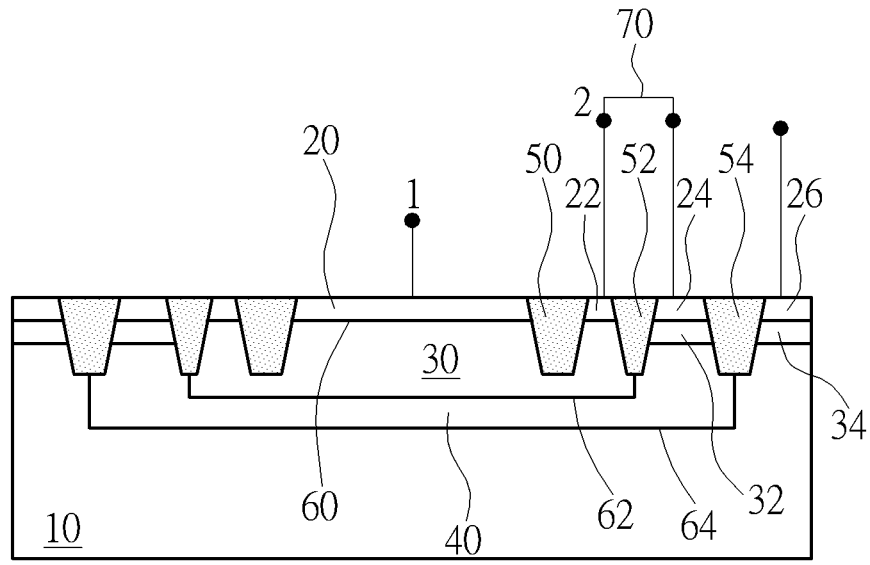
FIG. 5 is the schematic cross-sectional diagram of a diode according to one embodiment of the invention.
FIG. 6 shows the experimental operation conditions of "stand-by" and "on" operations of the diode as shown in FIG. 5.

Please refer to FIG. 5, which is the schematic cross-sectional diagram according to one embodiment of the invention. According to one embodiment of the embodiment, the first doping region 20 has the N type conductivity. The second doping region 22 and the first well 30 have the P type conductivity, and a P/N junction 60 is between the first doping region 20 and the first well 30. The third doping region 24, the second well 32 and the deep well 40 have the N type conductivity, and another P/N junction 62 is between the deep well 40 and the first well 30. The fourth doping region 26, the third well 34 and the substrate 10 have the P type conductivity, and another P/N junction 64 is between the deep well 40 and the substrate 10. One feature of the present invention is that the second doping region 22 and the third doping region 24 are electrically connected by a connecting structure 70, to ensure that they are in the same electrical potential.

When there is no potential difference between the first doping region 20 and the second doping region 22, there is no obvious current flow in the diode. When a forward bias which is greater than the potential barrier of the P/N junction 60, for example, 0.7V for Si substrate, is applied to the diode, a forward current $I_f$ (not shown) flows from the second doping region 22, along the first well 30 under the first isolation 50 and across the P/N junction 60, to the first doping region 20. The first doping region 20 is regarded as the cathode 1 of the diode, and the second doping region 22 is regarded as the anode 2.

Please refer to FIG. 6, which illustrates the experimental operation conditions of the diode as shown in FIG. 5. It should be understood that these are the preferred exemplary conditions, and should not be limitations on operating the diode in practice. During the "stand-by" operation, the first doping region 20 (cathode), the second doping region 22 (anode) and the third doping region 24 (electrode A) are coupled to a voltage $V_{DD}$. The fourth doping region 26 (electrode B) is coupled to a voltage $V_{GND}$. During the "stand-by" operation, there is no potential energy applied to the P/N junction 60 and the P/N junction 62 respectively, and the P/N junction 64 is reverse-biased. There is sustainably no current flowing in the diode.

During the "on" operation, the first doping region 20 (cathode) is coupled to a voltage $V_{on}$ while the second doping region 22 (anode) is still coupled to a voltage $V_{dd}$, and the fourth doping region 26 (electrode B) is coupled to a voltage $V_{GNN}$. The P/N junction 60 is forward biased, and the resulting forward current $I_f$ flows from the second doping region 22, along the first well 30 under the first isolation 50 and across the P/N junction 60, to the first doping region 20. It should be noted that during the "on" operation, the P/N junction 62 is zero-biased and the P/N junction 64 is reverse-biased. The potential barriers of the P/N junction 62 and the P/N junction 64 decrease the opportunity for the forward current $I_f$ to flow to the substrate 10, to become the leakage current. The P/N junction 62 and the P/N junction 64 provide an enhanced isolation effect between the first well 30 and the substrate 10.

It should be noticed that, in another exemplary embodiment, the third doping region 24, the second well 32 and the deep well 40 may have the same conductivity type as the second doping region 22 and the first well 30, and may be electrically coupled to the second doping region 22 and the first well 30 by the connecting structure 70. In this case, both the second doping region 22 and the third doping region 24 are regarded as the anode.

Another objective of the present invention is to provide a preferred range of the aspect ratio, at which the diode with the multiple-concentric-rectangular-ring structure as shown previously may have better performance.

Figure 7:
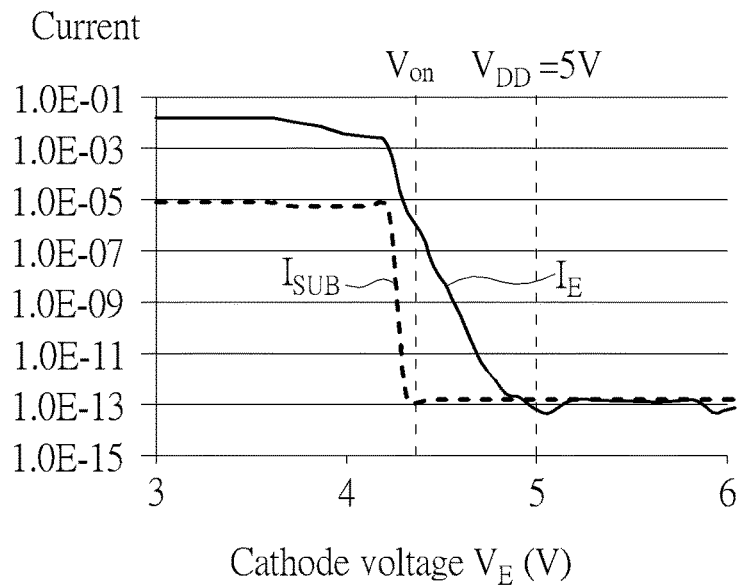
FIG. 7 shows the variation of the cathode current $I_E$ and the leakage current $I_{sub}$ of the diode as shown in FIG. 5 in response to the varying cathode voltage $V_E$ applied to the cathode while the anode is coupled to a fixed anode voltage.
Figure 8:
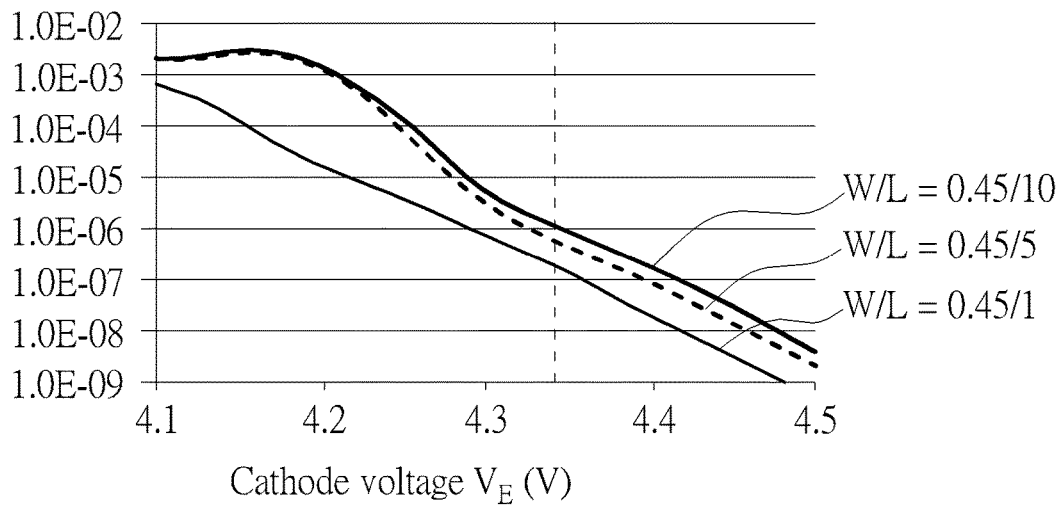
FIG. 8 and FIG. 9 illustrate the respective variation of the cathode current $I_E$ and the leakage current $I_{sub}$ in response to the varying cathode voltage $V_E$ of three diodes according to the present invention, where the three diodes have different aspect ratios.
Figure 9:
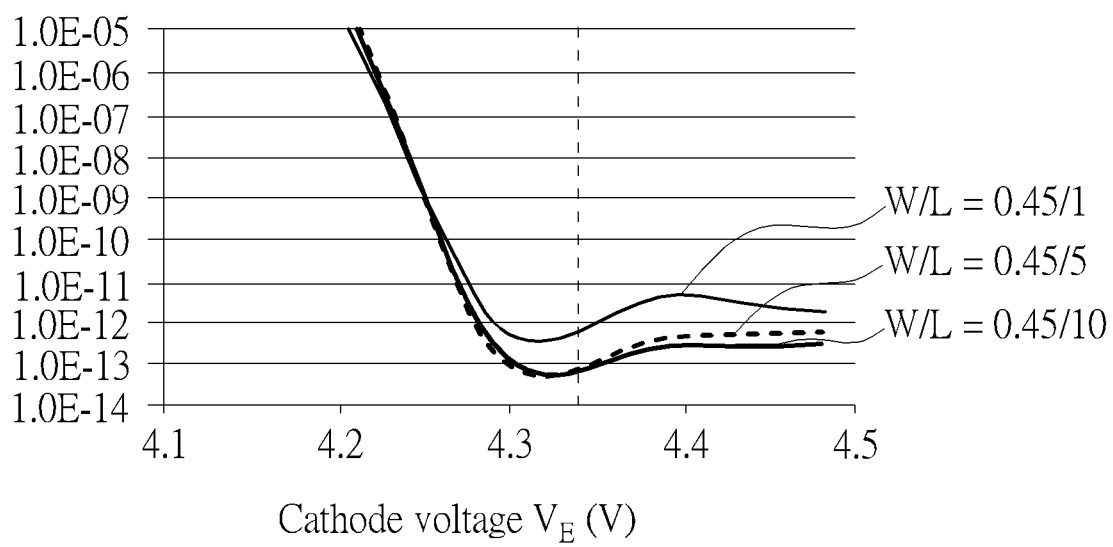

FIG. 7 to FIG. 9 illustrate the characteristics of an exemplary diode according to the present invention when it is forward-biased. It should be noticed that the operation conditions as shown in the diagrams are preferred exemplary experimental conditions, and should not be limitations on operating the diode in practice.

FIG. 7 is the characteristic curve of the exemplary diode according to the present invention, showing the variation of the cathode current $I_E$ and the leakage current $I_{sub}$ in response to the varying cathode voltage $V_E$ while the anode is coupled to a fixed anode voltage. In the following description, the current flow to the cathode is regarded as the cathode current $I_E$, and the current flow to the substrate is regarded as the leakage current $I_{sub}$. The voltage coupled to the cathode is regarded as the cathode voltage $V_E$. During the "stand-by" operation, the cathode and the anode are both coupled to a voltage at, for example, 5V. The measured cathode current $I_E$ and the leakage current $I_{sub}$ are very small, for example, 1E-15 ampere (A). It is substantially considered to have no current. As the cathode voltage decreases gradually from 5V and the anode voltage is kept at 5V, the diode is increasingly forward-biased. The cathode current $I_E$ increases gradually but the leakage current is approximately kept at the same level. When the anode voltage is 5V and the cathode voltage $V_E$ is smaller than a certain value, for example, 4.3V, the leakage current increases abruptly. According to the characteristic curve shown in FIG. 7, it is preferred to set the "on" voltage, which is the voltage applied to the cathode of the exemplary diode according to the embodiment, to be between 4.3V and 4.4V in order to get the larger cathode current $I_E$ and the smaller leakage current $I_{sub}$.

FIG. 8 and FIG. 9 illustrate the respective variation of the cathode current $I_E$ and the leakage current $I_{sub}$ in response to the varying cathode voltage $V_E$ of three exemplary diodes according to the present invention, where the three diodes have different aspect ratios. According to the present embodiment, all of the three diodes have the multiple-concentric-rectangular ring structure as shown in FIG. 3. The widths of the each diode's first doping region 20 are the same, but the lengths are different. According to the embodiment, the width is 0.45 µm, and the length is 1 µm, 5 µm, and 10 µm respectively. The calculated aspect ratio of each diode's first doping region 20 is 2, 10 and 20 respectively. The width and length values aforesaid are a preferred experimental embodiment, and should not be a limitation to the invention. The first isolation structure 50, the second doping region 22, the second isolation region 52, the third doping region 24, the third isolation region 54 and the fourth doping region 26 of each diode may have substantially the same aspect ratio as the first doping region 20 of itself.

As shown in FIG. 8, when the cathode voltage is between 4.3V and 4.4V, the diode with the 10 µm first doping region 20 has the largest cathode current $I_E$, followed by the diode with the 5 µm first doping region 20, and the diode with the 1 µm first doping region 20 has the smallest cathode current $I_E$. According to the result of the present embodiment, it is known that the cathode current $I_E$ increases as the aspect ratio of the diode increases.

As shown in FIG. 9, when the cathode voltage is between 4.3V and 4.4V, the diode with first doping region 20 having width of 5 µm or 10 µm has smaller leakage current $I_{sub}$ than the diode which's first doping region 20 has width of 1 µm.

According to the experimental result as described above, it may be concluded that the diode may have larger cathode current $I_E$, smaller leakage current $I_{sub}$ and better performance when the aspect ratio of the first doping region 20 is larger. The tendency aforesaid may still be seen when the current is normalized by the cathode area of the diode. According to the tendency observed from the experiment result of the exemplary diodes according to the present invention, it is preferred that the aspect ratio of the first doping region 20 is between 2 and 10. According to a best embodiment, the aspect ratio of the first doping region 20 is between 10 and 20.

The diode with the multiple-concentric-rectangular-ring structure according to the present invention may provide larger forward current and smaller leakage current when it is forward biased. Furthermore, when the aspect ratio of the diode is larger, the performance is better.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A diode structure, comprising:
   a substrate;
   a first doping region disposed in the substrate, wherein the first doping region has a first conductive type and is a rectangle from the top view, and has an aspect ratio of dividing the length of the first doping region by the width of the first doping region larger than 2;
   a second doping region, encircling the first doping region and having a second conductive type, wherein the first conductivity type and the second conductivity type are complementary;
   a first isolation structure disposed between the first doping region and the second doping region;
   a third doping region, encircling the second doping region;
   a second isolation structure disposed between the second doping region and the third doping region;
   a fourth doping region, encircling the third doping region; and
   a third isolation structure disposed between the third doping region and the fourth doping region, wherein the first isolation structure, the second doping region, the second isolation structure, the third doping region, the third isolation structure and the fourth doping region are arranged in a sextuple concentric rectangular ring encircling the first doping region from the top view.

2. The diode structure according to claim 1 further comprising a connecting structure, wherein the connecting structure is electrically connecting the second doping region and the third doping region.

3. The diode structure according to claim 1, wherein the aspect ratio of the first doping region is between 2 and 10.

4. The diode structure according to claim 1, wherein the aspect ratio of the first doping region is between 10 and 20.

5. The diode structure according to claim 1, wherein the aspect ratios of the first isolation structure, the second doping region, the second isolation structure and the third doping region in the quadruple concentric rectangular ring are the same as that of the first doping region.

6. The diode structure according to claim 1, wherein the first doping region, the second doping region and the first isolation structure are disposed in a first well which has the second conductive type.

7. The diode structure according to claim 6, wherein the first doping region is the cathode of the diode, and the second doping region is the anode of the diode.

8. The diode structure according to claim 6, wherein the first well, the third doping region and the second isolation structure are encompassed by a deep well.

9. The diode structure according to claim 8, wherein the third doping region and the deep well have the first conductive type.

10. The diode structure according to claim 8, wherein the third doping region and the deep well have the second conductive type.

11. The diode structure according to claim 10, wherein the first doping region is the cathode of the diode, and the electrically connected second doping region and the third toping region are the anode of the diode.

12. The diode structure according to claim 8 further comprising a second well disposed between the third doping region and the deep well, and the second well is fully separated from the first well by the second isolation structure.

13. The diode structure according to claim 1, wherein the first isolation structure, the second doping region, the second isolation structure, the third doping region, the third isolation structure and the fourth doping region have the same aspect ratio as the first doping region.

14. The diode structure according to claim 1, further comprising a third well-disposed between the fourth doping region and the substrate.

* * * * *